United States Patent [19]

Martin

[11] Patent Number: 4,777,909
[45] Date of Patent: Oct. 18, 1988

[54] CARRIAGE APPARATUS FOR INDEXING AND ACCURATELY REGISTERING A SELECTED STABILIZED MASK OF A PLURALITY OF STABILIZING MASKS BETWEEN A SUBSTRATE AND A SOURCE

[75] Inventor: Richard T. Martin, Santa Barbara, Calif.

[73] Assignee: Applied Magnetics Corporation, Goleta, Calif.

[21] Appl. No.: 129,881

[22] Filed: Nov. 24, 1987

Related U.S. Application Data

[63] Continuation of Ser. No. 271,545, Jun. 8, 1981, abandoned, which is a continuation-in-part of Ser. No. 232,842, Feb. 9, 1981, abandoned.

[51] Int. Cl.[4] .............................................. C23C 14/04
[52] U.S. Cl. .................................... 118/720; 118/721; 118/724; 118/729
[58] Field of Search ............... 118/715, 720, 721, 729, 118/504, 505, 724; 204/298; 427/282

[56] References Cited

U.S. PATENT DOCUMENTS

| | | | |
|---|---|---|---|
| 3,241,519 | 3/1966 | Lloyd | 118/720 |
| 3,312,190 | 4/1967 | Bradshaw | 18/720 |
| 3,315,637 | 4/1967 | Taylor | 118/504 X |
| 3,669,060 | 6/1972 | Page et al. | 118/721 X |
| 3,747,558 | 7/1973 | Harel | 118/721 X |
| 4,372,248 | 2/1983 | Martin | 118/720 |
| 4,373,470 | 2/1983 | Martin | 118/720 |

*Primary Examiner*—Richard Bueker
*Attorney, Agent, or Firm*—Daniel J. Meaney, Jr.

[57] ABSTRACT

Apparatus for indexing and accurately registering a selected stabilized mask of a plurality of stabilized masks between a substrate and a source during vacuum deposition wherein the apparatus has a mask supporting frame including a mechanism for supporting at least two stabilized masks each having openings which define a pattern and wherein the at least two stabilized masks are supported in a planar spaced relationship relative to each other and have a preselected spacing between the centers thereof, guide and support rollers operatively coupled to the mask supporting frame for supporting the mask supporting frame for lateral movement along a predetermined path between a first position and a second position wherein the first position indexes one of said two of the stabilized masks between a substrate and a source at a working station and the other of the two stabilized masks at a different location along the predetermined path and wherein the second position indexes the other of the two stabilized masks at the same working station and the one of the two stabilized masks at another different location along the predetermined path, a drive member operatively coupled to the mask supporting frame for moving the same in a linear direction along the predetermined path between the first position and the second position to index a selected stabilized mask of the two stabilized masks to a working station and a gantry assembly for supporting a substrate in a predetermined relationship to the source and having reference registration members for positioning and accurately registering the substrate relative to prealigned registration members located on the selected stabilized mask indexed to the working station is shown.

10 Claims, 2 Drawing Sheets

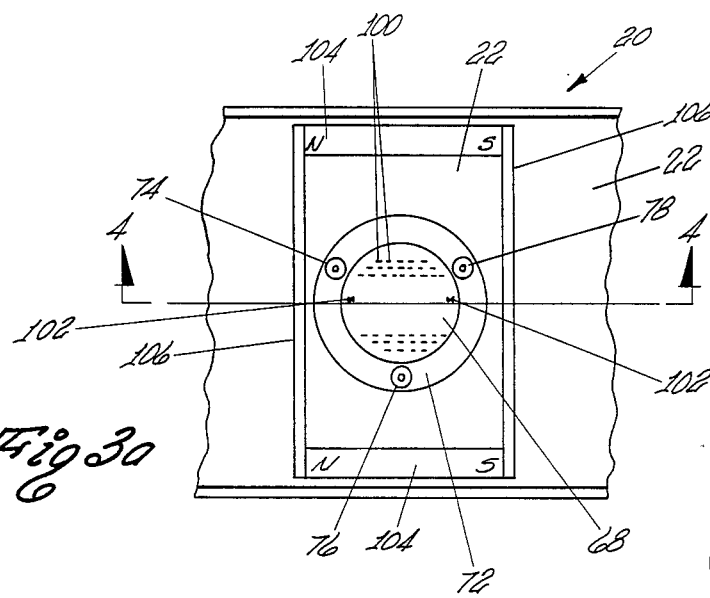
Fig 3a
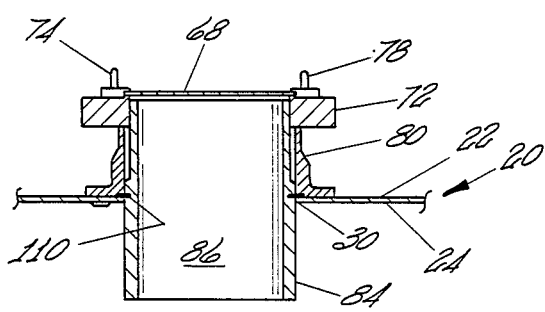
Fig 3b
Fig 4
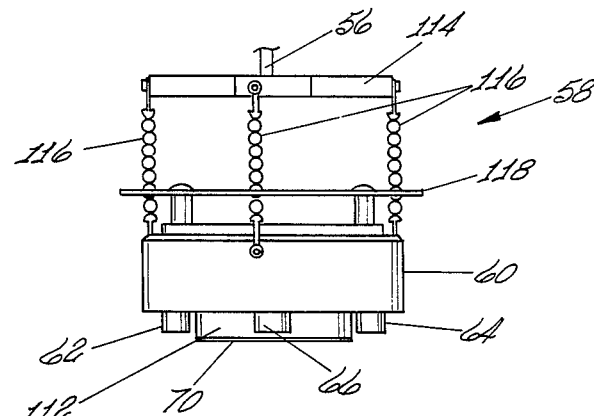
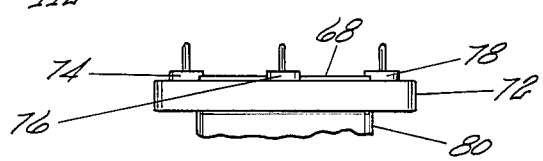
Fig 5

CARRIAGE APPARATUS FOR INDEXING AND ACCURATELY REGISTERING A SELECTED STABILIZED MASK OF A PLURALITY OF STABILIZING MASKS BETWEEN A SUBSTRATE AND A SOURCE

This application is a continuation of application Ser. No. 271,545, filed June 8, 1981, which is a continuation-in-part of Ser. No. 232,842 filed Feb. 9, 1981, both are abandoned.

BACKGROUND OF THE INVENTION

1. Field of the Invention

This invention relates to a carriage apparatus for positioning a selected stablized mask of a plurality of stabilized masks between a substrate and a source and more particularly to a carriage apparatus having a mask supporting frame for supporting at least two stabilized masks for lateral movement along a predetermined path between a first position and second position wherein at least one of the two stabilized masks is positioned between a substrate and a source at a working station. The carriage apparatus is utilized for indexing a selected stabilized mask from a plurality of stabilized masks between a substrate and a source in a vacuum deposition process.

2. Description of the Prior Art

It is known in the prior art to form thin film magnetic transducers by use of vapor deposition techniques. Examples of thin film transducers so produced are disclosed in Gibson U.S. Pat. Nos. 4,191,983 and 4,143,458, which are assigned to the assignee of the present invention.

In fabrication of thin film magnetic transducers, it is common to form a pair of magnetic pole piece layers having deposited coils forming a coil winding therebetween and the two pole pieces which may have one or more layers per pole piece, having an interim gap formed therebetween. The gap is utilized for a transducing gap adapted to be positioned adjacent a recording media. In fabrication of the pole piece layers and one or more winding layers, any one of several techniques can be used in order to precisely control the width, length, depth and registration of the various layers relative to the prior deposited and post deposited layers. Typical of a magnetic transducer formed using such technique is that disclosed in U.S. Pat. No. 3,867,868 to Lazzari.

It is also known in the art to form a multi-track thin film magnetic transducer having a plurality of vapor deposited thin film transducers formed of a pair of magnetic pole pieces and windings therebetween. Typical of such transducers are those disclosed in U.S. Pat. No. 4,092,688 to Nomura et al.

In the fabrication of the thin film magnetic transducers disclosed by the above-referenced Patents, it is known in the art to utilize a mask for controlling the pattern of deposited material onto a substrate during a deposition process.

One known prior art apparatus for forming thin film magnetic transducers of a plurality of vapor deposited layers utilizes a mask support assembly having a plurality of aligned apertures each of which support a mask having predetermined patterns formed therein. In fabrication of this type of thin film magnetic transducers, it is necessary to carry out the vapor deposition in a vacuum chamber. Accordingly, apparatus which is adapted to transport the mask support assembly having the mask thereon must be located in the vacuum chamber in order to position a selected mask between a vapor deposition source and a substrate. It is known in the art to index the mask support assembly having a plurality of masks to position a selected mask adjacent a substrate. The mechanism for indexing a selected mask from a plurality of masks in the mask support assembly also performs the function of aligning the mask to the substrate. In fabricating this type of thin film magnetic transducers, it is necessary that precise registration occur between the mask and the substrate so that registration and positioning of deposited layers can be accurately controlled.

Other known techniques for fabricating thin film magnetic transducers include applying layers of preselected materials onto a substrate by use of known vacuum deposition, sputtering, plating, or chemical vapor deposition and then to selectively remove portions of the so formed layer by use of photo-lithographic techniques. In use of photo-lithographic techniques, the photo-resist material is coated onto the metallic thin film formed on the substrate by vacuum deposition, sputtering, plating or chemical vapor deposition processes. The photo-resist material is developed to form a photo-resist with a predetermined pattern wherein portions of the thin film layer to be removed are exposed and subjected to a chemical etching solution resulting in each layer of material in the thin film produced transducer having patterns of a preselected length, width, and depth in geometrical shape as determined by the photo-resist pattern formed thereon. One such method is disclosed in U.S. Pat. No. 3,891,995 to Hanazono et al.

A variation of this use of a photo-resist layer may include applying a layer of photo-resist material onto a substrate and forming apertures through the layer corresponding to areas to be plated. If an electroplating process is to be used, a layer of conductive material underlies the photo-resist layer and is used as a cathode in the plating process. If an electroless plating process is used, the layer of conductive material may be eliminated.

Another known technique for forming a thin film magnetic transducer is disclosed in U.S. Pat. No. 3,766,640 to Hahn. It utilizes magnetically permeable foil having grooves and a predetermined pattern formed therein which is adapted to receive deposited insulator and conductor material therein and which results in the foil member acting as both a portion of the magnetic transducer and as a pattern which determines the geometrical shape, width, and depth of the deposited layers.

Another known technique utilizes plating through a mask with a conductive material to form plated layers of magnetic insulating and conductive materials which define a plated layer magnetic transducer.

SUMMARY OF THE INVENTION

This invention relates to a new, novel and unique apparatus for indexing and accurately registering a selected stabilized mask from a plurality of stabilized masks between a substrate and a vapor deposition source. The apparatus for positioning a selected stabilized mask of a plurality of stabilized masks between a substrate and a source during vacuum deposition includes a mask supporting frame including means for supporting at least two stabilized masks each having openings which define a pattern and wherein the at least two stabilized masks are supported in a planar spaced relationship relative to each other and having a preselected spacing between the centers thereof. Means operatively coupled to the mask supporting frame supports the same for lateral movement along a predetermined path between a first position and a second position. The first position indexes one of the two of the stabilized masks between the substrate and a source at a working station and the other of the two stabilized masks at a different location along the predetermined path. The second position indexes the other of the two stabilized masks at the working station and the one of the two stabilized masks at another different location along the predetermined path. Means are operatively coupled to the mask supporting frame for moving the mask supporting frame in a linear direction along the predetermined path between the first position and the second position to index a selected stabilized mask of the two stabilized masks to the working station. Gantry means are provided for supporting a substrate in a predetermined relationship to the source. The gantry means includes means for positioning and accurately registering the substrate relative to a selected stabilized mask indexed to the working station. The gantry means is adapted to lift and withdraw the substrate away from the selected stabilized mask positioned at the working station enabling the moving means to move the mask supporting frame between the first and second position indexing a different stabilized mask to the working station whereupon the gantry means positions and accurately registers a substrate relative to the selected stabilized mask indexed at the working station wherein the indexed stabilized mask located at the working station permits material from the source to pass through the selected stabilized mask onto the substrate to form a layer of material on the substrate corresponding to the pattern of the indexed selected stablized mask.

In use, the present invention provides a unique and novel apparatus wherein a selected stabilized mask of a plurality of stabilized masks can be indexed to a working station and, by use of a gantry means, a substrate can be accurately registered to the indexed stabilized mask. In the preferred embodiment, the selected stabilized mask is positioned between a source of vapor deposition material and a substrate such that a vapor of the deposition material passes through the mask onto the substrate.

In the preferred embodiment, the apparatus includes an elongated mask support assembly. In use, the elongated mask support is subjected to high temperatures and, in response thereto, it essentially grows in length and width due to thermal expansion resulting in warping, bending and the like. Accordingly, transporting means, guiding means and support means are provided which are capable of indexing a selected stabilized mask to a working station independent of the elongated mask supporting frame dimensions which vary in response to variations in ambient temperature, stress and the like and without binding and sticking which could otherwise occur from these variations.

The present invention overcomes several of the disadvantages of prior apparatus and methods. In known prior art methods for forming thin film transducers using the vapor deposition process, a carriage mask support assembly transported a plurality of metal masks along a predetermined path relative to a plurality of working apertures. Each metal mask included a plurality of different discrete patterns arranged therein in a predetremined array. The carriage mask support assembly performed the function of positioning a selected pattern of each mask of the plurality of masks relative to a selected working aperture. A substrate is positioned on one side of the working apertures and a vapor deposition source was positioned on the other side of the working apertures. In essence, the prior art apparatus in the form of a carriage mask support assembly attempted to mechanically index a plurality of masks in a ganged relationship to a working station defined by each of the apertures and, concurrently, precisely register a selected mask pattern to the substrates.

Typically, the known carriage mask support assemblies, when exposed to high temperatures such as that encountered in a vacuum deposition process, results in the carriage mask support assembly undergoing dimensional changes due to thermal expansion, warping and distortions. In the known prior art apparatus, the masks were clamped to a carriage mask support assembly by means of fasteners. When the mask and carriage mask support assembly were exposed to the varying conditions of the thermal environment, at thermal conditions normally experienced in a vapor deposition process, both the mask and carriage mask support assembly expanded and contracted during the process. In the prior art apparatus, the changes in dimension due to such expansion and contraction, warping and distortion of both the mask itself and of the carriage mask support assembly were uncompensated. Thus, in a multi-step process where a plurality of masks had to be indexed and accurately positioned to a substrate, the temperature of the mask and carriage mask support assembly had to be held at a constant temperature to minimize the effect of thermal expansion or contraction of both the mask and carriage mask support assembly. In operation, the temperature of the mask and the carriage mask support assembly and the substrate support assembly still varied due to normal variation of the thermal environment during the process causing variation in dimension between the mask, carriage mask support assembly and its relationship to the substrate even though an attempt was made to thermally stabilize the same. The normal thermal variation induces misregistration between the masks relative to the substrate and the layers deposited on the substrate.

Therefore, the known prior art apparatus lack means to precisely register the carriage-mask support assembly to a substrate in order to obtain repeatable accurate registration of a selected mask to a substrate. By use of the teachings of the present invention which overcomes the prior art apparatus' inability to precisely register a selected mask to a substrate in a vapor deposition process with varying thermal environment conditions, layers of selected material can be deposited by vapor deposition in a precise location on the substrate in a multistep process in varying thermal environment conditions.

An advantage of the present invention is that distortion caused by thermal expansion, contraction, warping, bending or the like of a carriage assembly due to varying thermal environment conditions will affect only the coarse indexing of a selected mask to a substrate at a working station and its adverse effects on precise registration of a mask to a substrate are eliminated.

In the known prior art apparatus for positioning a mask in a deposition work stage, the carriage assembly undergoes constant expansion, contraction and warpage due to variation in temperature which occurs principally during the heating and cooling of the mask support assembly.

In order to minimize the effects of contraction, expansion and warpage of a mask, the prior art apparatus utilized fastening means to fixedly attach the mask to a carriage base in order to obtain accurate registration of the mask to a substrate at a working station. However, mask misregistration still occurred due primarily to variations in the coefficient of expansion between the mask, the carriage base and the substrate positioning mechanism which located the substrates relative to the working apertures and the masks. Even if the mask, carriage base and substrate locating mechanism were of the same material, the mass, thickness and difference in geometrical dimension, temperature gradients and shape resulted in malfunction or inadequate performance of the mask registration system.

One advantage of the present invention is that the carriage assembly performs the function of indexing a mask to a working station and the effects of contraction, expansion and warpage of the elongated mask supporting frame do not affect either the function of indexing and registration.

Still another advantage of the present invention is that the elongated mask supporting frame, which forms a part of the elongated mask support assembly, can have nonlinear or non-uniform thermal expansion in both its length and width and still be indexed to any selected mask along the entire length of the carriage assembly such that the selected mask is indexed to a substrate or working station independent of the thermal expansion of the elongated mask supporting frame.

A still yet further advantage of the present invention is that the teachings hereof can be utilized to fabricate any number of devices or components such as, without limitation, thin film magnetic transducers, thin film resistors, thin film capacitors, inductors, transformers, networks, integrated circuits and the like.

BRIEF DESCRIPTION OF THE DRAWING

The foregoing and other advantages and features of this invention will become apparent from the following description of the preferred embodiment when considered together with the illustrations and the accompanying drawing which includes the following Figures:

FIG. 3a is a partial top plan view of one aperture within the elongated mask supporting frame having a mask supported therein;

FIG. 3b is a pictorial representation of an alignment target illustrated in FIG. 3a to afford precise alignment between stabilized masks;

FIG. 4 is a partial front sectional elevational view of a portion of the elongated mask supporting frame having a stabilized mask and a shield means mounted therein; and FIG. 5 is a front elevational view of that portion of a gantry assembly including the gantry means for accurately registering a substrate relative to an indexed stabilized mask with the gantry means and substrate illustrated in a withdrawn position relative to the stabilized mask support assembly and stabilized mask.

DESCRIPTION OF THE PREFERRED EMBODIMENT

Figure 1:
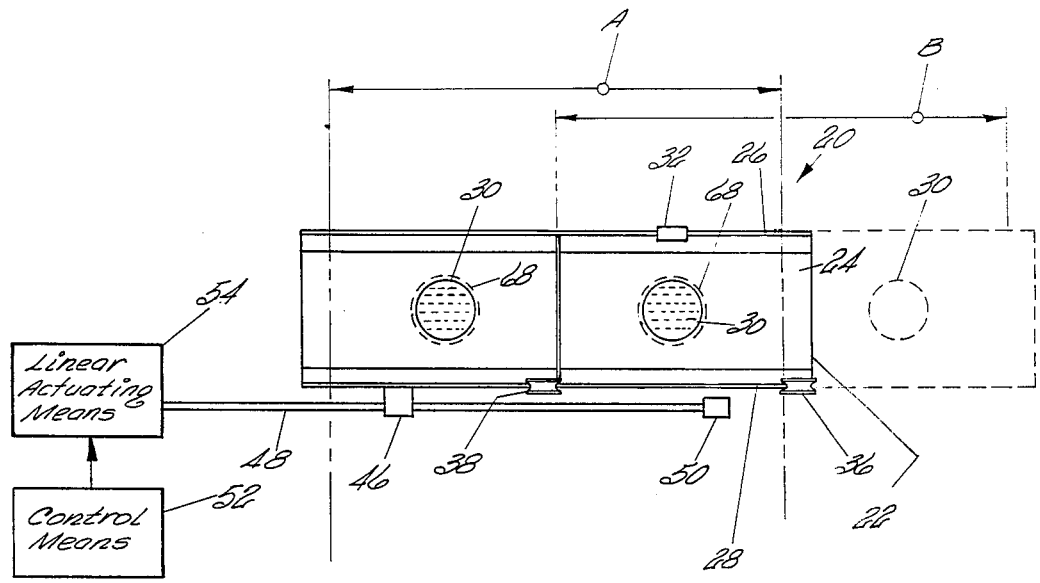
FIG. 1 is a bottom plan view, partially in schematic, showing a carriage apparatus which includes an elongated mask supporting frame having apertures formed therein and means for indexing the mask supporting frame to a working station.
Figure 2:
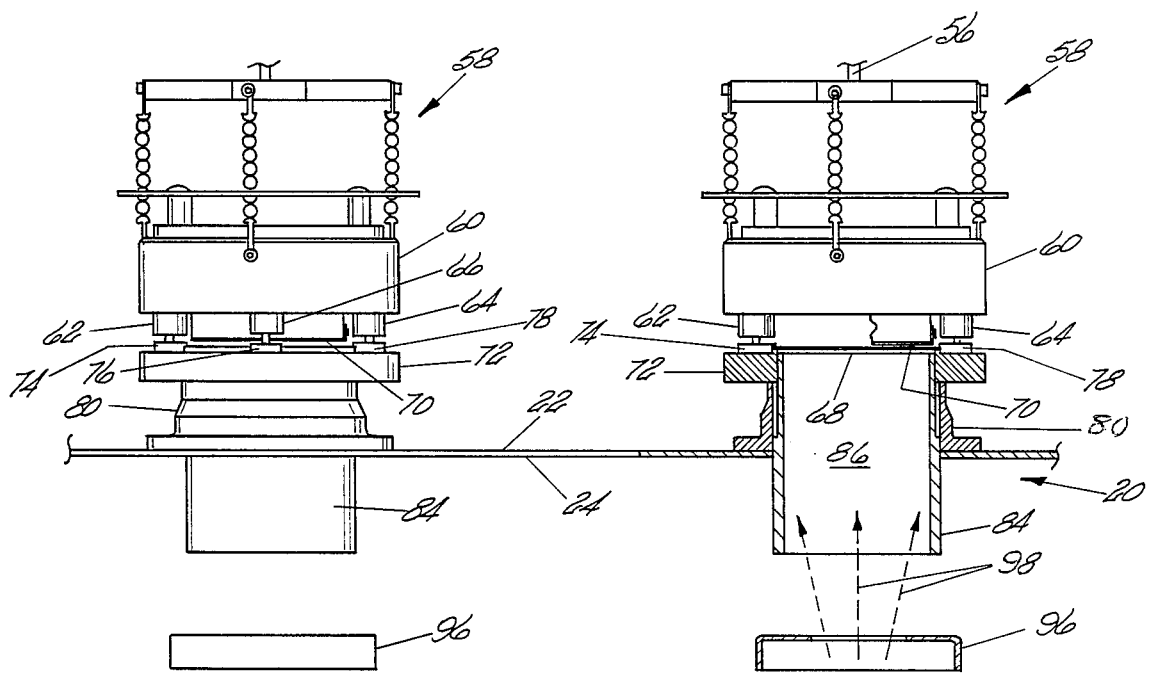
FIG. 2 is a front elevational view partially in section, showing an elongated mask supporting frame, a plurality of stabilized masks located in the apertures formed therein and means in the form of a gantry means for accurately registering a substrate to an indexed stabilized mask for our specific application.

FIG. 1 discloses a carriage apparatus for positioning a selected stabilized mask of a plurality of stabilized masks between a substrate and a source. In the embodiment of FIG. 1, the carriage apparatus includes two stabilized masks where at least one of the stabilized masks is positioned at a work station. In its broadest aspects and as shown in the bottom view of FIG. 1, the carriage apparatus includes a carriage means comprising an elongated mask supporting means such as an elongated mask supporting frame 20 having an upper surface 22 and a lower surface 24. The elongated mask supporting frame 20 includes means for defining a plurality of apertures 30 which extend from the upper surface 22 to the lower surface 24. Each aperture 30 has a predetermined diameter and a preselected spacing between the centers of each aperture. Each of the apertures 30 can be adapted to have a stabilized mask, shown by dashed lines 68, positioned therein as illustrated in FIG. 2. The apertures 30 are adapted to support the stabilizing masks 68 having openings therein which define a pattern. The structures of the mask are illustrated in greater detail in FIGS. 2 and 3a.

In the preferred embodiment, the carriage apparatus includes means for defining supporting and guiding elements on the elongated mask supporting frame 20.

In the preferred embodiment, the guiding and supporting elements include a pair of spaced, parallel, generally elongated support rails 26 and 28 which are located and extend along the periphery of the lower surface of the elongated mask supporting frame 20. Also, in the preferred embodiment, the means for defining the support surface includes a pair of spaced, parallel, generally elongated side walls extending along the periphery of the upper surface 22 of the elongated mask supporting frame defining a mask supporting means and which are in opposed alignment with the elongated support rails.

In the preferred embodiment, the means for supporting the elongated mask supporting frame 20 are provided. As shown in FIG. 3, a support roller 32 having an outer cylindrical rail bearing surface is adapted to engage and dynamically support one of the pair of rails 26 and 28 on the elongated mask supporting frame 20 which defines the supported element. The support roller 32 rotates about an axis which is substantially normal to the direction of elongation of the elongated mask supporting frame. In the preferred embodiment, the support roller has a selected axial length and the outer cylindrical rail bearing surface has a width which is at least equal to the width of the rail surface and any thermal expansion of the width of the carriage.

Means for guiding the elongated mask supporting frame are provided. In the preferred embodiment, a pair of guide rollers, 36 and 38 are provided, each of which have an outer grooved, recessed rail bearing surface to engage, guide and dynamically support the other of the pair of rails which define the guiding elements. Each of the guide rollers 36 and 38 rotates about an axis which is substantially normal to the direction of elongation of the elongated mask supporting frame 20 and the guide rollers 36 and 38 are positioned parallel to and equidistantly one on each side of and in alignment with the axis of the support roller 32. Each of the outer grooved recessed rail bearing surfaces of each guide roller 36 and 38 is adapted to rotatably engage the other of the pair of rails to maintain the same in a fixed position within the recessed groove during conveyance of the elongated mask support assembly.

The elongated mask supporting frame 20 is transported relative to the pair of guide rollers 36 and 38 and the center of gravity of the elongated mask support frame 20 is maintained between the guide rollers 36 and 38, with such an arrangement, the elongated mask supporting frame is supported an equivalent three point suspension and support defined by the outer cylindrical rail bearing surface of the support roller 32 and the outer grooved, recessed rail bearing surface of the guide rollers 36 and 38.

The lateral movement of the elongated mask supporting frame 20 along a predetermined path between a first position, shown by arrow A, and a second position, shown by arrow B, is provided by a linear actuating means 54 which is coupled by rod 48 through support 46 to the elongated mask supporting frame 20.

The first position "A" locates one of the two stabilized masks 34 along the predetermined path between the substrate and a source at a working station, and the other of the two stabilized masks at a different location along the predetermined path. The second position locates the other of the two stabilized masks at the same working station and the one of said two stabilizing masks at another different location along the predetermined path. The different locations may, in fact, be another working station having separate sources and substrates.

As illustrated in FIG. 2, a gantry assembly 58 includes a gantry means 60 for positioning and accurately registering a substrate 70 relative to a stabilized mask support assembly 72 which holds a stabilized mask 68 in an operative position. However, the gantry means 60 is adapted to be withdrawn by the gantry assembly 58 together with a substrate 70 away from the selected stabilized mask 68 positioned in accurate registration with the selected stabilized mask 68 at the working station. Of course, any appropriate means may be used to withdraw the gantry assembly 58 with the substrate 70 from the mask 68.

Referring again to FIG. 2, the stabilized mask support assembly 72 has prealigned registration members 74, 76 and 78 located therein. The gantry means 60 has reference registration members 62, 64 and 66 located thereon and which are responsive to the gantry means 60 being positioned relative to the selected stabilized mask 68 to enable the reference registration members 62, 64 and 66 on the gantry means 60 to co-act with the prealigned registration members 74, 76 and 78 to accurately register the substrate 70 in a precise position relative to the selected stabilized mask 68. The reference registration members 62, 64 and 66 are adapted to co-act with the prealigned registration members 74, 76 and 78 of each stabilized mask 68 to insure that the substrate 70 is accurately registered relative to a selected stabilized mask 68 which is indexed at the working station by the mask supporting frame 20.

With the gantry assembly 58 in the raised or withdrawn position, the elongated mask supporting frame 20 is then activated by the linear actuating means 54 to transport a different stabilized selected mask 30, which may have any selective pattern, to the working station.

As shown in FIG. 1, the elongated mask supporting frame 20 is moved between the first position "A" and the second position "B" to index a different stabilized mask to the working station. After a different mask is indexed to the work station, the gantry assembly 58 then moves the gantry means 60 to accurately register the substrate 70 relative to a different mask then positioned at the work station.

The prealigned registration members and the reference registration members may be any appropriate mechanism to insure alignment between the gantry means and mask support housing 72. In the preferred embodiment, as shown in FIGS. 4 and 5, a pin and pin receiving socket are utilized for these elements.

FIG. 2 illustrates that a means 56, which is responsive to the linear actuating means 54 or to the control means 52 (both shown in FIG. 1), is provided for moving the gantry means 60, through the gantry assembly 58, together with the substrate 70 from the accurately registered position into a withdrawn position. In this position, the mask supporting frame 20 is enabled to move the stabilized masks between the first position and the second position. Thereafter, the means 56 repositions and accurately registers the gantry means 60 with the substrate 70 relative to the stabilized mask indexed to the working station.

The elogated mask support means 20 includes mask frame support housing 80 for affixing the stabilized mask support assembly 72 to the elongated mask support frame 20. A shielding means 84 extends a predetermined distance from a preselected side of the stabilizing mask 68 for enclosing a vapor of deposition material emanating from a source 96 through the indexed selected stabilized mask 68 located at the working station. As illustrated in the cross-sectional portion of FIG. 2, the shielding means 84 defines a cavity 86 which encloses the vapor of deposition material from a source 96 as illustrated by arrow 98. The shielding means 84 functions to prevent vapor deposition material from collecting on or building up on other parts of the apparatus.

FIG. 3a illustrates in greater detail the relationship between the elongated mask supporting frame 20 and a stabilized mask 68 which is supported by the stabilized mask support assembly 72 in its position relative to the aperture 30 (of FIG. 1) extending from the upper surface 22 to the lower surface 24 (of FIG. 1).

In the preferred embodiment, the stabilized mask support assembly 72 is thermally stabilized by maintaining the same at a constant selected temperature by use of a temperature sensing and heating means (not shown). In order to stabilize the mask 68 having openings 100 which define a pattern thereon, the stabilized mask 68 is affixed to the stabilized mask housing assembly 72 and, when the stabilized mask is indexed to the working station, the mask is under tension which preferably is applied by the stabilized mask assembly housing 72. If desired, the stabilized mask 68 may be heated by heating means (not shown) to thermally stabilize the same and to effect the magnitude of the tension force in the stabilized mask. The combination of tension and thermal stability results in the stabilized mask 68 being mechanically and thermally stable during operation at the working station in a vacuum during a deposition process. If desired, magnets 104 and magnetic pole elements 106 may be positioned adjacent the mask support assembly 72 to control the magnetic orientation of a vapor deposited layer of magnetic material on the substrate.

The stabilized mask 68 has alignment target 102 which is illustrated in greater detail in FIG. 3b.

FIG. 3a illustrates that the preferred embodiment of the prealigned registration members 74, 76 and 78 are in the form of individual adjustable alignment pins supported in individual pin housings. Both the pins and pin housings are formed with eccentrics such that each alignment pin position can be adjusted within the stabilized mask support assembly 72 by rotation of the pins and pin housings. The stabilized mask 68 is affixed to the mask support assembly 72 such that adjustment of the pins and pin housings adjusts the position of the prealigned registration members relative to the position of the stabilized mask pattern 100 and to the mask support assembly 72. Thus, the apparatus includes means for precisely adjusting the prealigned registration members 74, 76 and 78 on the stabilized mask support assembly 72 to fixedly align the pattern 100 of the stabilized mask 68 to the substrate by means of the prealigned registration members co-acting with the reference registration members located on the gantry means 60.

In a multi-step vapor deposition process, the alignment of the deposited layers on the substrate is important and, in certain applications, very critical. Likewise, the alignment of the deposited layers to the substrate itself may be critical. In the apparatus of the present invention, prealignment of each mask is necessary to accomplish the above. The prealignment can be accomplished by use of two different prealignment techniques, both of which utilize the precise adjustment feature of the adjusting means of the prealigned registration members. Although the precise alignment can be obtained by use of the patterns on each of the stabilized masks, the preferred embodiment includes a target means 102 shown in FIGS. 3a and 3b which may be used to facilitate the desired alignment. One technique is to engage one stabilized mask with the gantry means 60, or a fixture simulating the gantry means, such that the prealigned registration members 74, 76, and 78 of the stabilized mask support assembly 72 co-act with the the reference registration members 62, 66 and 64 of the gantry means 60. In using this technique, the locations of the target means 102 are noted with respect to the gantry means 60 thereby essentially making the target means of the first stabilized mask a reference. Thereupon, the pins and pin housings of subsequent stabilized masks are adjusted to move the pins to precisely register the target means 102 to the reference locations established by the first stabilized mask. Thereafter, each stabilized mask is prealigned relative to the first stabilized mask by superimposing the location of the target means 102 in axial alignment therewith to obtain precise alignment between each of the stabilized masks relative to each other. This technique insures that each pattern and layers deposited therethrough onto the subtrate will be fixedly aligned one to the other.

A second technique is to select specific locations relative to the substrate. With the first stabilized mask positioned with its prealigned registration means co-acting with the reference registration means in the gantry means, the adjusting means thereof are precisely adjusted to superimpose the target means 102 in axial alignment with the selected specific locations relative to the substrate. Thereafter, each mask is preferably precisely adjusted using the same technique which results in each mask being fixedly aligned to the substrate and to each other.

FIG. 4 shows details of the prealigned registration members 74 and 78 located on the stabilized mask support assembly 72 and FIG. 5 shows the reference registration members 62, 64 and 66 located on the gantry means 60.

FIG. 4 shows a portion of the elongated mask supporting frame 20 having the upper surface 22 and the lower surface 24. A mask frame support housing 80 cooperates with the stabilized mask support assembly 72 to support a mask 68 relative to the aperture 30 in the elongated mask supporting frame 20. Mask frame support housing 80 is attached to elongated mask support frame 20. A locking ring 110 fastens the shielding means, in the form of an elongated thin wall housing 84 having a hollowed out central area 86, between the elongated mask supporting frame 20 and mask frame support housing 80. Mask frame support housing 80 provides rotational constraint of the stabilized mask support assembly 72 through a pin and a notch arrangement. The mask frame support housing 80 supports the mask support assembly 72 and the shielding means 84 holds the mask support assembly 72 concentric with the aperture 30 and with each other.

In FIG. 4, two alignment pins are illustrated, pins 74 and 76. Since FIG. 4 is a sectional view, pin 76, illustrated in FIG. 3a is not shown but forms a third pin for the three pin alignment system.

FIG. 5 illustrates one embodiment of a gantry assembly 58 for supporting a substrate 70 relative to the stabilized mask 68 of FIGS. 3a and 4. Reference registration members 62, 66 and 64 are adapted to co-act with prealigned registration members 74, 76 and 78 respectively. A stabilized substrate support housing 112 is adapted to support the substrate 70 and to stabilize the substrate 70 in a secure stable position. A support platform 114 supports the gantry means 60 including the substrate housing 112 through three flexible chain members 116. An intermediate plate 118 may be used as a heat shield and as a support for other components such as electrical connectors if required in the gantry assembly 58.

When the gantry means 60 as illustrated in FIG. 5 is positioned relative to the stabilized mask support assembly 72 containing the prealigned registration members, the reference registration members of the gantry means 60 co-act with the prealigned registration members to permit the reference registration members to nestle into proper alignment with the prealigned registration members such that the substrate 70 is accurately registered relative to a selected stabilized mask 68.

In FIG. 5, the stabilized mask support housing 72, the stabilized mask 68 and the prealigned registration members 74, 76 and 78 are spaced from and illustrate the gantry assembly 58 being held in a withdrawn position by support 56 such that the gantry means 60 including the substrate 70 is lifted away from the elongated mask supporting frame 20.

In the preferred embodiment of the present invention, the carriage apparatus for indexing a selected stabilized mask from a plurality of stabilized masks is adapted for use with a vapor deposition source which is located at a working station. However, it is envisioned and anticipated that the carriage apparatus hereof has wide application in all types of deposition systems including, without limitation, sputtering systems, chemical vapor deposition systems, plating techniques and the like.

In addition, it is envisioned that one or more gantry means could be used so that parallel deposition of a layer onto a substrate can occur so that one or more masks and/or substrates are utilized or that one or more working areas are provided during each deposition step.

Of importance is the fact that the mask supporting frame provides a means for providing a coarse indexing of an aperture, mask assembly and associated shielding means relative to a source and that the precise final accurate registering is obtained by aligning the gantry means with the substrate relative to the stabilized mask. Prior to the deposition process, it is anticipated that each of the masks would be prealigned to the gantry means such that accurate registration would occur between the gantry means, the stabilized mask and substrate at any location and when any stabilized mask is positioned within the working station.

In addition, it is possible that one or more of the layers being deposited during the vacuum deposition would be a magnetic layer which could form the magnetic circuit for a thin film magnetic device. In such event, it is desirable to preorientate the magnetic means within the magnetic material during deposition thereof. FIG. 3a illustrates that one or more sections of the mask supporting frame 20 could include a set of parallel spaced aligned magnets 104 and magnetic pole elements 106 to provide the desired magnetic orientation in the magnetic domains. Of course, the spaced parallel aligned magnets 104 and magnetic pole elements 106 could be located selectively within any section of the mask supporting frame as desired. In utility, a wide range of thin film deposited components can be fabricated using the teachings of this invention. The preferred embodiment of the present invention is to form thin film magnetic transducers which require precisely aligned pole pieces, windings, layers and the like. However, it is possible to fabricate other electronic components such as capacitors, resistors, transformers, inductors including combinations thereof and the like using the multi-step, multi-mask technique including the use of the unique carriage apparatus disclosed herein.

It is also envisioned that other techniques be used to increase the reliability, registability and other effects of the mask to substrate interface by providing means for further stabilizing the mask, heating and/or temperature regulating of the stabilized mask, the stabilized mask supporting housing, the substrate and substrate support housing during deposition, or any combination thereof in order to minimize misregistration due to the effects of thermal expansion and uncontrolled variables.

What is claimed is:

1. Apparatus for indexing and accurately registering a selected stabilized mask of a plurality of stabilized masks between a substrate with a predetermined spacing and position between the substrate and selected stabilizing mask and a source during vacuum deposition comprising a mask supporting frame including means for supporting at least two stabilized masks each having openings which define a pattern and wherein each of said stabilizing masks includes a temperature stabilized mask support assembly which maintains its geometrical dimension over the temperature range at which the direct deposition of a thin film pattern on a substrate is performed during a vacuum deposition process and wherein each stabilized mask is under a tension with a substantial portion of the periphery of each of said tension stabilized mask being affixed to its stabilized mask supporting assembly to absorb thermal stresses developed in the mask over said temperature range to maintain dimensional stability of said stabilized mask over said temperature range, said at least two stabilized masks being supported in a planar spaced relationship relative to each other and have a preselected spacing between the centers thereof;

means operatively coupled to said mask supporting frame for supporting the same for lateral movement along a predetermined path between a first position and a second position, said first position being adapted to index each one of said two stabilized masks between a said substrate and a said source at a working station and the other of said two stabilized masks at a different location along said predetermined path, said second position being adapted to index the other of said two stabilized masks at the same working station and said one of said two stabilized masks at another different location along said predetermined path;

means operatively coupled to said mask supporting frame from moving the same in a linear direction along said predetermined path between said first position and said second position to index a selected stabilized mask of said two stabilized masks to a said working station; and gantry means for supporting a substrate at a predetermined spacing and position in a predetermined relationship to a said source, said gantry means including means for positioning and accurately registering a said substrate relative to a said selected stabilized mask indexed to a said working station, said gantry means being adapted to withdraw a said substrate away from a said selected stabilized mask positioned at a said working station enabling said moving means to move said mask supporting frame between said first and second positions indexing a different stabilized mask to a said working station whereupon said gantry means positions and accurately registers a said substrate relative to a said selected stabilized mask indexed at a said working station wherein a said indexed selected stabilized mask located at a said working station permits material from a said source to pass therethrough onto a said substrate to form a layer of material on the substrate corresponding to the pattern of said indexed selected stabilized mask at the working station.

2. The apparatus of claim 1 further comprising
   shielding means extending a predetermined distance from a preselected side of each of said stabilized masks for enclosing a vapor of deposition material emanating from a said source and passing to a said substrate through a said indexed selected stabilized mask located at a said working station.

3. The apparatus of claim 1 further wherein said
   stabilized mask support assembly includes prealigned registration members located thereon in a predetermined pattern; and
   reference registration members located on said gantry means and responsive to said gantry means being positioned relative to said selected stabilized mask to enable said reference registration members on said gantry to co-act with the prealigned registration members for accurately registering a said substrate in a precise position relative to a said selected stabilized mask, said reference registration members being adapted to co-act with the prealigned registration members of each of said stabilized mask to insure that a said substrate is accurately registered relative to a selected stabilized mask which is indexed at a said working station by said mask supporting frame.

4. The apparatus of claim 3 further comprising
means for precisely adjusting said prealigned registration members on each mask support assembly independently from said prealigned registration memhbers on other mask supporting assemblies to fixedly align each patter of each of said stabilized masks to a reference.

5. The apparatus of claim 4 wherein each stabilized mask has a target means positioned at a predetermined location thereon relative to the pattern of the stabilized mask, said adjusting means being adapted to superimpose said target means of a said stabilized mask with a specific reference to otain precise alignment between at least one of said stabilized masks relative to each of the other stabilized masks and to a said substrate.

6. The apparatus of claim 3 comprising
linear actuating means operatively coupled to said mask supporting rame to move the same between said first position and said second position when said gantry means is in said withdrawn position.

7. The apparatus of claim 1 wherein said mask supporting frame is in the form of an elongated mask supporting frame having a plurality of apertures formed thereon for supporting one of each of said stabilized masks thereon.

8. The apparatus of claim 6 further comprising
control means operatively coupled to said linear actuating means to program said linear actuating means to move said mask supporting frame between said first position and said second position.

9. The apparatus of claim 8 further comprising
means responsive to at least one of said linear actuating means and said control means for moving said gantry means including a said substrate relative to a selected stabilized mask from an accurately registered position into a withdrawn position enabling said mask supporting frame to move said stabilized masks between said first position and said second position and for repositioning and accurately registering the gantry means with a said substrate at a predetermined spacing and position relative to said selected stabilized mask indexed to a said working station.

10. The apparatus of claim 8 further comprising
means operatively coupled to said mask supporting frame for guiding the same as it is moved along said predetermined path.

* * * * *